United States Patent [19]
Welty

[11] Patent Number: 5,997,705
[45] Date of Patent: Dec. 7, 1999

[54] RECTANGULAR FILTERED ARC PLASMA SOURCE

[75] Inventor: Richard P. Welty, Boulder, Colo.

[73] Assignee: Vapor Technologies, Inc., Boulder, Colo.

[21] Appl. No.: 09/291,455

[22] Filed: Apr. 14, 1999

[51] Int. Cl.$^6$ .................................................. C23C 14/32
[52] U.S. Cl. .................. 204/298.41; 204/298.08; 204/298.14; 204/298.17; 204/298.02; 204/298.11; 204/192.38; 204/192.12
[58] Field of Search .................. 204/298.08, 298.14, 204/298.16, 298.17, 298.41, 298.02, 298.11, 192.38, 192.12

[56] References Cited

U.S. PATENT DOCUMENTS

| | | |
|---|---|---|
| 3,783,231 | 1/1974 | Sablev et al. . |
| 3,793,179 | 2/1974 | Sablev et al. ...................... 204/298.41 |
| 4,031,424 | 6/1977 | Penfold et al. . |
| 4,116,806 | 9/1978 | Love et al. . |
| 4,194,962 | 3/1980 | Cambers et al. ................... 204/298.23 |
| 4,404,077 | 9/1983 | Fournier . |
| 4,428,259 | 1/1984 | Kubo et al. . |
| 4,430,184 | 2/1984 | Mularie ............................. 204/192.38 |
| 4,448,659 | 5/1984 | Morrison, Jr. . |
| 4,452,686 | 6/1984 | Axenov et al. .................... 204/298.41 |
| 4,486,289 | 12/1984 | Parsons et al. .................... 204/298.09 |
| 4,492,845 | 1/1985 | Kluchko et al. ................... 219/121.36 |
| 4,515,675 | 5/1985 | Kieser et al. . |
| 4,559,121 | 12/1985 | Mularie . |
| 4,581,118 | 4/1986 | Class et al. . |
| 4,600,489 | 7/1986 | Lefkow . |
| 4,717,968 | 1/1988 | Painton et al. . |
| 4,749,587 | 6/1988 | Bergmann et al. . |
| 4,801,217 | 1/1989 | Goldberg ................................ 405/75 |
| 4,812,217 | 3/1989 | George et al. . |
| 4,849,088 | 7/1989 | Veltrop et al. . |
| 4,933,064 | 6/1990 | Geisler et al. . |
| 4,994,164 | 2/1991 | Bernardet . |
| 5,133,850 | 7/1992 | Kukla et al. . |
| 5,160,585 | 11/1992 | Berg . |
| 5,262,028 | 11/1993 | Manley . |
| 5,266,178 | 11/1993 | Sichmann . |
| 5,269,898 | 12/1993 | Welty ................................. 204/298.41 |
| 5,277,778 | 1/1994 | Daube et al. . |
| 5,277,779 | 1/1994 | Henshaw . |
| 5,279,723 | 1/1994 | Falabella et al. .................. 204/192.38 |
| 5,282,944 | 2/1994 | Sanders et al. .................... 204/192.38 |
| 5,317,235 | 5/1994 | Treglio .............................. 315/111.41 |
| 5,364,518 | 11/1994 | Hartig et al. . |
| 5,380,421 | 1/1995 | Gorokhovsky . |
| 5,387,326 | 2/1995 | Buhl et al. ........................ 204/192.38 |
| 5,403,457 | 4/1995 | Nago et al. . |
| 5,404,017 | 4/1995 | Inuishi et al. . |
| 5,433,836 | 7/1995 | Martin et al. . |
| 5,433,838 | 7/1995 | Martin et al. ..................... 204/298.41 |
| 5,435,900 | 7/1995 | Gorokhovsky ..................... 204/298.41 |
| 5,451,308 | 9/1995 | Sablev et al. . |
| 5,480,527 | 1/1996 | Welty . |
| 5,482,611 | 1/1996 | Helmer et al. . |
| 5,512,156 | 4/1996 | Yamanishi et al. . |
| 5,518,597 | 5/1996 | Storer et al. . |
| 5,531,877 | 7/1996 | Latz et al. . |
| 5,587,207 | 12/1996 | Gorokhovsky . |
| 5,589,039 | 12/1996 | Hsu . |
| 5,597,459 | 1/1997 | Atshuler . |
| 5,730,847 | 3/1998 | Hanaguri et al. .................. 204/298.41 |
| 5,804,041 | 9/1998 | Hurwitt . |
| 5,840,163 | 11/1998 | Welty ................................. 204/192.38 |

*Primary Examiner*—Alan Diamond
*Attorney, Agent, or Firm*—Myron B. Kapustij; Lloyd D. Doigan

[57] ABSTRACT

An apparatus is disclosed for generating oppositely directed streams of plasma for the purpose of depositing a coating or performing ion processing. The plasma comprises ionized vapor of a cathode material, generated by vacuum arc evaporation from a linear magnetron cathode. The plasma is diverted by a deflection electrode to a substrate region, while the macroscopic droplets of cathode material also generated by the arc are intercepted and prevented from reaching the substrate. Magnetic means are disclosed for controlling the arc motion on the cathode surface while simultaneously deflecting and guiding the plasma. The source may be extended indefinitely in length, permitting coating or ion processing of large substrates.

3 Claims, 4 Drawing Sheets

RECTANGULAR FILTERED ARC PLASMA SOURCE

FIELD OF THE INVENTION

This invention relates to vapor deposition apparatus for depositing a coating on a substrate. More particularly it relates to cathodic arc evaporation apparatus.

BACKGROUND OF THE INVENTION

Cathodic arc evaporation has during the last two decades come into wide commercial use for deposition of metal, alloy, and metal compound coatings. Cathodic arc discharges can also be used as plasma sources for ion processing operations such as implantation, sputter etching, reactive etching, and diffusion. A cathode of the material to be deposited is vaporized by a high current, low voltage arc plasma discharge in a vacuum chamber which has been evacuated to a pressure of typically less than 0.001 mbar. Typical arc currents range between 25 and 1000 amperes, with voltages between 15 and 50 volts. An undesirable side effect of cathodic arc evaporation is the generation of molten droplets of cathode material. These droplets are commonly called macroparticles, and range in diameter from submicron to tens of microns. The macroparticles can become embedded in the coating when they land on the substrate or can stick and later fall off, causing surface defects in either case.

Strategies for reducing the number of macroparticles reaching the substrate fall generally into two categories. The first is those using some form of magnetic field to control and accelerate the arc, in order to reduce macroparticle generation. The second category is those using a filtering apparatus between the cathode and the substrates which transmits at least part of the ionized vapor but blocks at least some of the molten droplets. The magnetic methods are generally simpler but do not completely eliminate macroparticle generation. The filtering methods are generally more effective at removing macroparticles, but require complex apparatus and reduce the source output significantly.

Rectangular plasma sources are desirable for the coating or ion processing of large substrates, sheet material in roll form, and for quantities of smaller substrates on a linear conveyor or circular carousel. Bi-directional sources are desirable since they increase the area over which the emitted plasma is distributed and can provide additional substrate capacity.

A publication by Aksenov, et al. ("Transport of plasma streams in a curvilinear plasma-optics system", Soviet Journal of Plasma Physics, 4(4), 1978) describes the use of a cylindrical plasma duct having a 90 degree bend, with electromagnet coils to create a solenoidal magnetic field through the duct. U.S. Pat. Nos. 5,279,723 (Falabella et al., 1994) and U.S. Pat. No. 5,433,836 (Martin, 1995) describe similar devices with cylindrical ducts with having 45 and 90 degree bends respectively. U.S. Pat. No. 4,492,845 (Kljuchko, 1985) describes a coaxial filtered arc evaporation apparatus having an annular cathode, with substrates to be coated disposed within the radius of the annular cathode. U.S. Pat. No. 4,452,686 (Axenov et al., 1984) and U.S. Pat. No. 5,282,944 (Sanders, et al., 1994) describe straight cylindrical filtering ducts with no bend, and with circular cathodes located at one end of the duct. U.S. Pat. No. 5,435,900 (Ghorokhovsky, 1995) and U.S. Pat. No. 5,840,163 (Welty, 1999) both describe filtered sources having a rectangular duct with a 90 degree bend with a cathode at one end. Sputtering cathodes having the shape of a bar of substantially rectangular cross-section, having erosion surfaces wrapping around a lengthwise periphery of the bar and having substantially bi-directional deposition distributions are disclosed in U.S. Pat. No. 4,194,962 (Chambers et al., 1980), 4,486,289 (Parsons et al., 1984) and U.S. Pat. No. 4,812,217 (George et al., 1989). Means for containing an arc on an evaporable surface are described in U.S. Pat. No. 3,793,179 (Sablev, 1974), U.S. Pat. No. 4,430,184 (Mularie, 1984), U.S. Pat. No. 5,387,326 (Buhl, 1995).

SUMMARY OF THE INVENTION

The present invention generates oppositely directed plasma streams over an extended length for purposes of forming a coating or performing ion processing of a substrate. The plasma is generated by means of a cathodic arc discharge using a linear magnetron cathode. The cathode has the shape of a rectangular bar as shown in FIG. 1. The evaporable surface wraps around a lengthwise periphery consisting of two opposite long sides and both ends of the bar. Plasma is emitted from the cathode in directions approximately perpendicular to all four faces of the evaporable surface. For a long cathode, most of the plasma is emitted in the two directions perpendicular to the long sides of the evaporable surface.

Macroparticles also emitted from the evaporable surface are prevented from reaching the substrate by a filtering apparatus comprising cathode side shields and deflection electrodes. The side shields are mounted along both edges of the evaporable surface, and project outward by a selected distance from the surface in order to block macroparticles emitted at low angles to the evaporable surface. The deflection electrodes are mounted parallel to and facing at least the long sides of the evaporable surface, and optionally facing the cathode ends as well. The deflection electrodes have a selected width and are mounted at a selected distance from the evaporable surface. The deflection electrodes function to split and redirect plasma stream from the evaporable surface into two opposite directions parallel to the electrodes and evaporable surface. The deflection electrodes also function to block macroparticles emitted at higher angles to the evaporable surface. The width of the deflection electrodes and their distance from the evaporable surface, as well as the distance by which the side shields project outward from the evaporable surface, are selected such that there is no line of sight from the evaporable surface to the substrate, i.e. a macroparticle emitted from any point on the evaporable surface and traveling in any direction toward the substrate will be blocked by either a cathode side shield or a deflection electrode.

Magnetic means are provided to generate a magnetic field parallel to both the deflection electrode and the evaporable surface of the cathode, and perpendicular to the cathode length. The magnetic field serves both to make arc discharge spots circulate continuously around the evaporable surface of the cathode and to increase the effectiveness of the deflection electrode. Redirection of the plasma by the deflection electrodes is accomplished by means of an electric field near the electrode surface. The electric field is of the polarity which repels positive ions from the electrode (i.e. the potential becomes increasingly positive for an ion approaching the electrode). At an electrically isolated deflection electrode an electric field develops spontaneously due to the different arrival rates of ions and electrons in the impinging plasma. A magnetic field parallel to the electrode surface reduces the electron arrival rate much more than the ion arrival rate (due to the electrons much smaller mass), causing the electrode potential to become more positive and hence more effective at repelling ions. The effectiveness of the deflection electrodes may be further increased by applying a positive bias voltage (with respect to the anode) to at least a portion of each deflection electrode by means of an additional power supply. The entire deflection electrode may be biased, or e.g. only a center segment facing the evaporable surface directly may be biased while the remainder of the deflector surface is connected to the anode or electrically floating.

The magnetic means may comprise electromagnets or permanent magnets. A simple solenoid coil wound around the outside of the deflection electrodes and cathode, as shown in FIG. 1, can provide a suitable field configuration. Two or more smaller solenoids may be used in order to shape the magnetic field or for convenience in fabrication and mounting as shown in FIG. 2. Alternatively the field may be generated by means of permanent magnets as shown in FIGS. 3 and 4. Electromagnets have the advantage that the magnetic field strength can be easily varied. They have the disadvantages of large size and weight, relatively high cost (including a power supply), and the requirement for cooling to prevent heat buildup during operation. Permanent magnets have the advantages of smaller size and lower cost, and require no cooling or power supply. The have the disadvantage that the magnetic field strength can be varied only by replacing the magnets.

The strength of the magnetic field and the deflection electrode bias voltage may be chosen to optimize plasma transmission for the particular material vaporized (atomic weight and average charge state). Magnetic field strengths in the range 20–100 gauss with electrode bias voltages in the range 5–50 volts are suitable for a variety of materials, although higher and lower field strengths and voltages may be employed within the scope of this invention. The deflection electrode width and spacing and the distance by which the side shield projects can vary within the limits imposed by the line-of-sight requirement. A shorter side shield projection distance requires a wider deflection electrode, and vice versa. Shorter side shields are desirable to maximize the amount of plasma escaping the cathode region and minimize coating buildup on the side shields. Wider deflection shields however occupy more space in the processing chamber, require larger magnetic assemblies, and may suffer increased transmission losses. Water cooling of the deflection electrodes and side shields may be necessary for continuous operation at high power. Bouncing of macroparticles off the deflection electrode can be reduced by means of multiple parallel baffles mounted perpendicular to the electrode as shown in FIG. 2. The height, spacing, number, and location of the baffles may be selected to ensure that macroparticles must make at least two bounces to exit the output aperture.

The anode of the discharge may comprise an electrically isolated structure within the vacuum chamber or may comprise one or more structures electrically grounded to the (metal) vacuum chamber or system ground. The anode must be in electrical contact with the plasma (i.e. impinged upon by a sufficient number of plasma particles to support the discharge) and is preferably a surface through which at least some of the magnetic flux lines parallel to the deflection electrodes pass.

The present invention differs from prior art filtered arc sources in its bi-directional output distribution, in the use of a linear magnetron cathode, in the general arrangement of deflection electrodes and substrate mounting areas, and in the novel permanent magnet arrangement. The features of the present invention make it possible to construct a compact and efficient rectangular plasma source which can be made as long as desired. The bi-directional output is well suited for a central source inside a rotating array of substrates, for example, or between two linear conveyors carrying substrates.

DETAILED DESCRIPTION OF THE PREFERRED EMBODIMENTS

Figure 1:
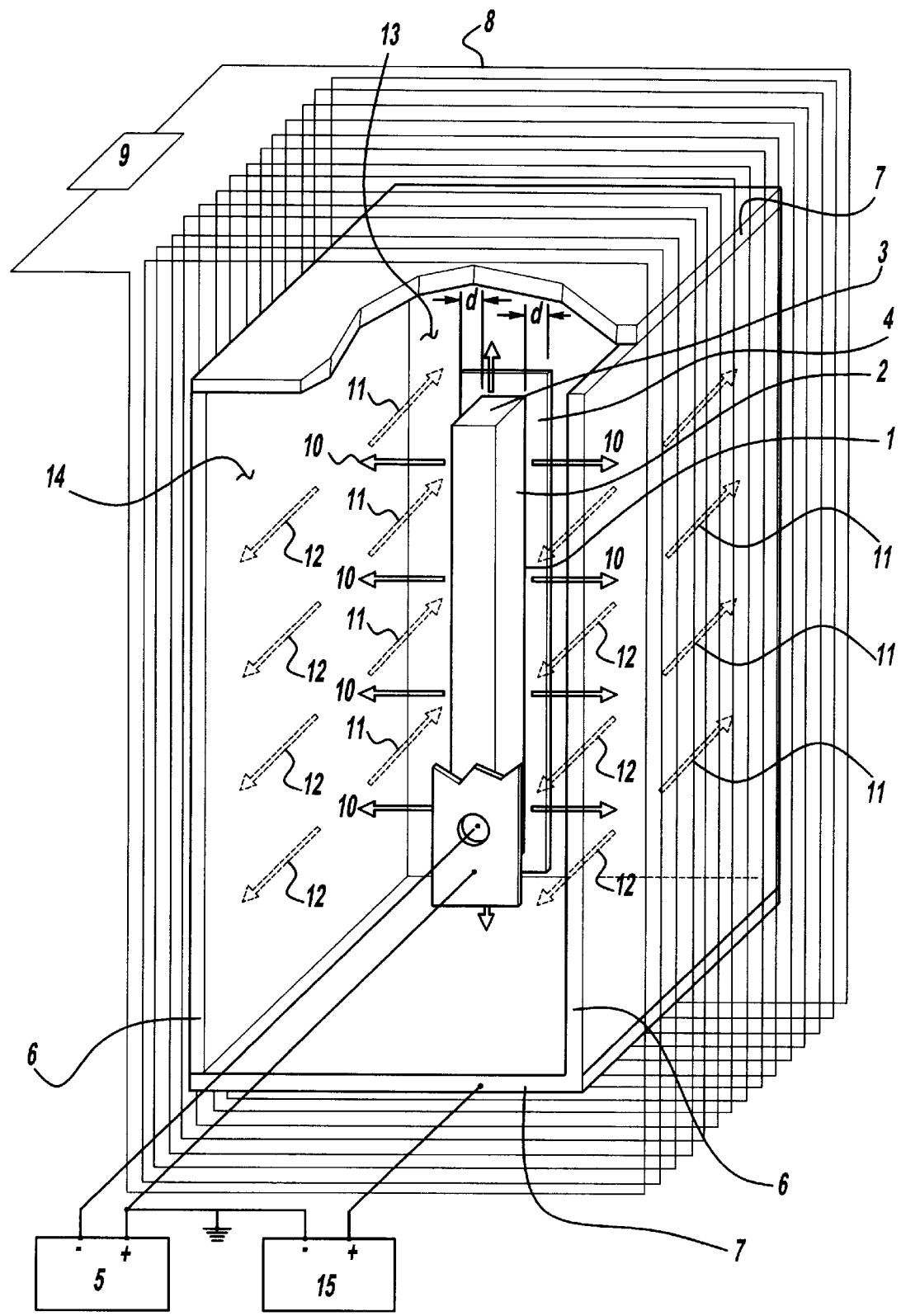
FIG. 1 is a schematic drawing of a filtered arc plasma source of the present invention using an electromagnet, showing arc, deflector bias, and magnet power supply connections.

In FIG. 1 a schematic drawing of the invention is shown in which the cathode 1 has an evaporable surface wrapping around the periphery consisting of long side 2, end 3, and their opposite surfaces. Cathode side shields 4 are disposed perpendicular to the evaporable surface along both edges, and projecting a distance "d" outward from the evaporable surface all around. Arc power supply 5 is connected at its negative terminal to cathode 1 and at its positive terminal to side shield 4 which also serves as an anode. Side deflection electrodes 6 are disposed parallel to the sides of the cathode 1. End deflection electrodes 7 may also be disposed parallel to the ends of the cathode to reduce end losses. An electromagnet coil 8 is disposed around the outside of the deflection electrodes 6 and 7 and is connected to coil power supply 9. The coil is aligned such that the solenoidal magnetic field generated is substantially parallel to all four faces of the evaporable surface and to the deflection electrodes. The apparatus may be operated coil current, and hence the magnetic field, in either polarity.

The deflection electrodes 6 and 7 may be connected to the positive output of deflection bias supply 15, the negative output of which is connected to the anode (side shield anode 4). Arrows 10 indicate the general direction of the plasma flow as it is emitted approximately perpendicular to the evaporable surface (i.e. in an angular distribution falling off as angle away from the surface normal increases). Arrows 11 and 12 indicate the oppositely-directed streams into which the plasma is split as it is redirected by deflection electrodes 6. Plasma streams 11 and 12 exit the source through oppositely facing output apertures 13 and 14.

Figure 2:
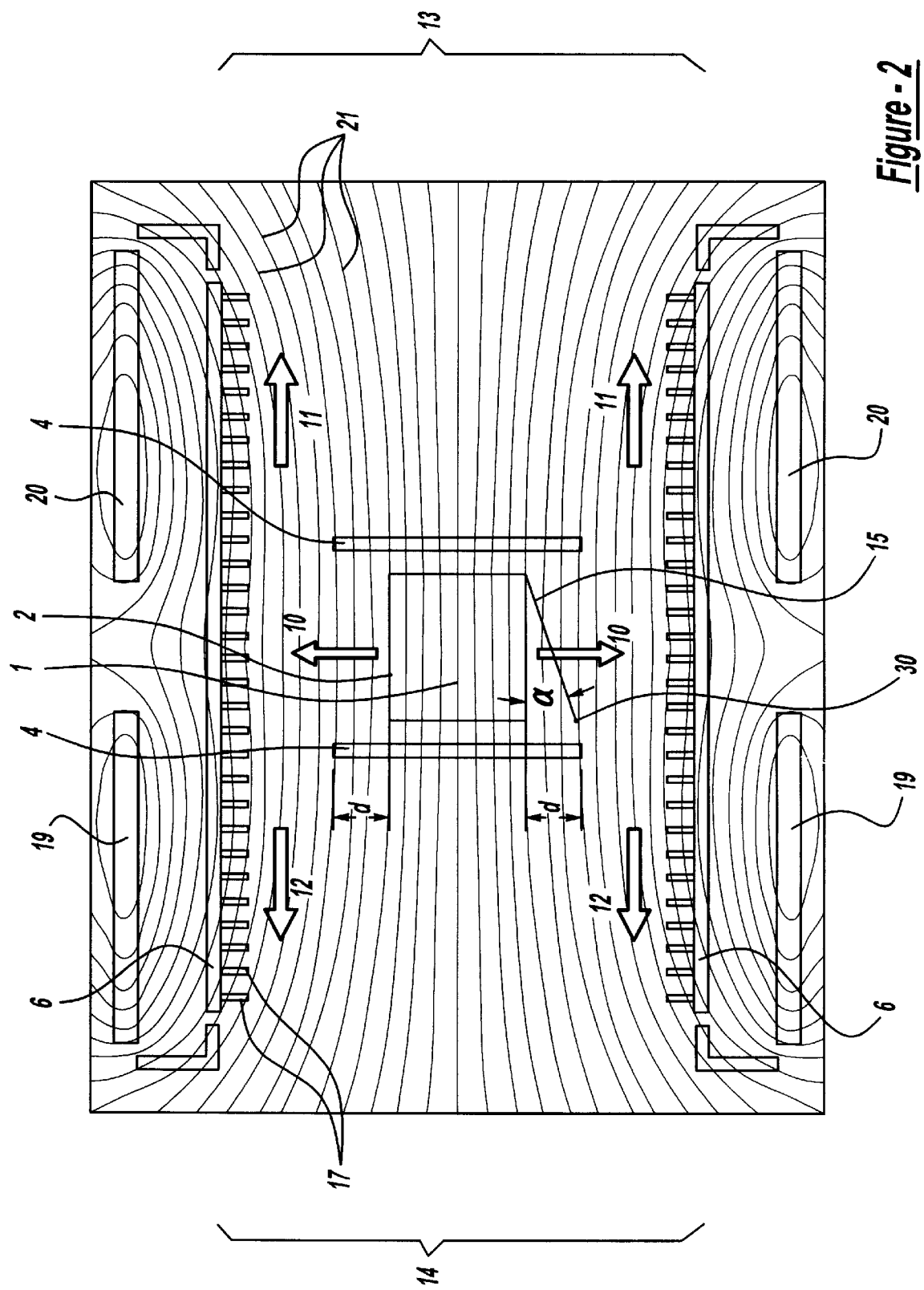
FIG. 2 is a cross-sectional drawing through a preferred embodiment of the invention using electromagnetic means, showing magnetic flux lines and macroparticle trajectories.

In FIG. 2 a cross section of a preferred embodiment is shown in which electromagnet coils 19 and 20 are disposed around the outside of deflection electrodes 6. Magnetic flux lines 21 generated by current in coils 19 and 20 are substantially parallel to evaporable surface faces 2 and to deflection electrodes 6. The shape and location of coils 19 and 20 were chosen by means of computer modeling to provide the desired magnetic field shape for the particular electrode geometry shown. The magnetic flux lines shown in FIGS. 2 and 4 were generated by a commercially available finite element magnetic analysis program ("Maxwell" from Ansoft Corporation, Pittsburgh, Pa.). For coils 19 and 20 carrying a current density of 1000 amperes/cm$^2$ and having relative dimensions as shown with respect to the electrodes, independent of actual scale, the field strength in the region adjacent to evaporable surfaces 2 is about 25 gauss.

The anode comprises side shields 4, which are connected to the positive output of the arc power supply and may preferably also be connected to the system ground. Deflection electrodes 6 may preferably be connected to the positive output of a deflection bias power supply, the negative output of which is connected to the anode. Baffles 17 are disposed perpendicular to electrodes 6 to reduce bouncing of macroparticles toward the output apertures 13 and 14. Arrow 15 shows a trajectory for a macroparticle 30 emitted at angle a from evaporable surface 2. Macroparticles emitted below angle a are blocked by side shields 4, while those above angle a are blocked by deflection electrodes 6.

Figure 3:
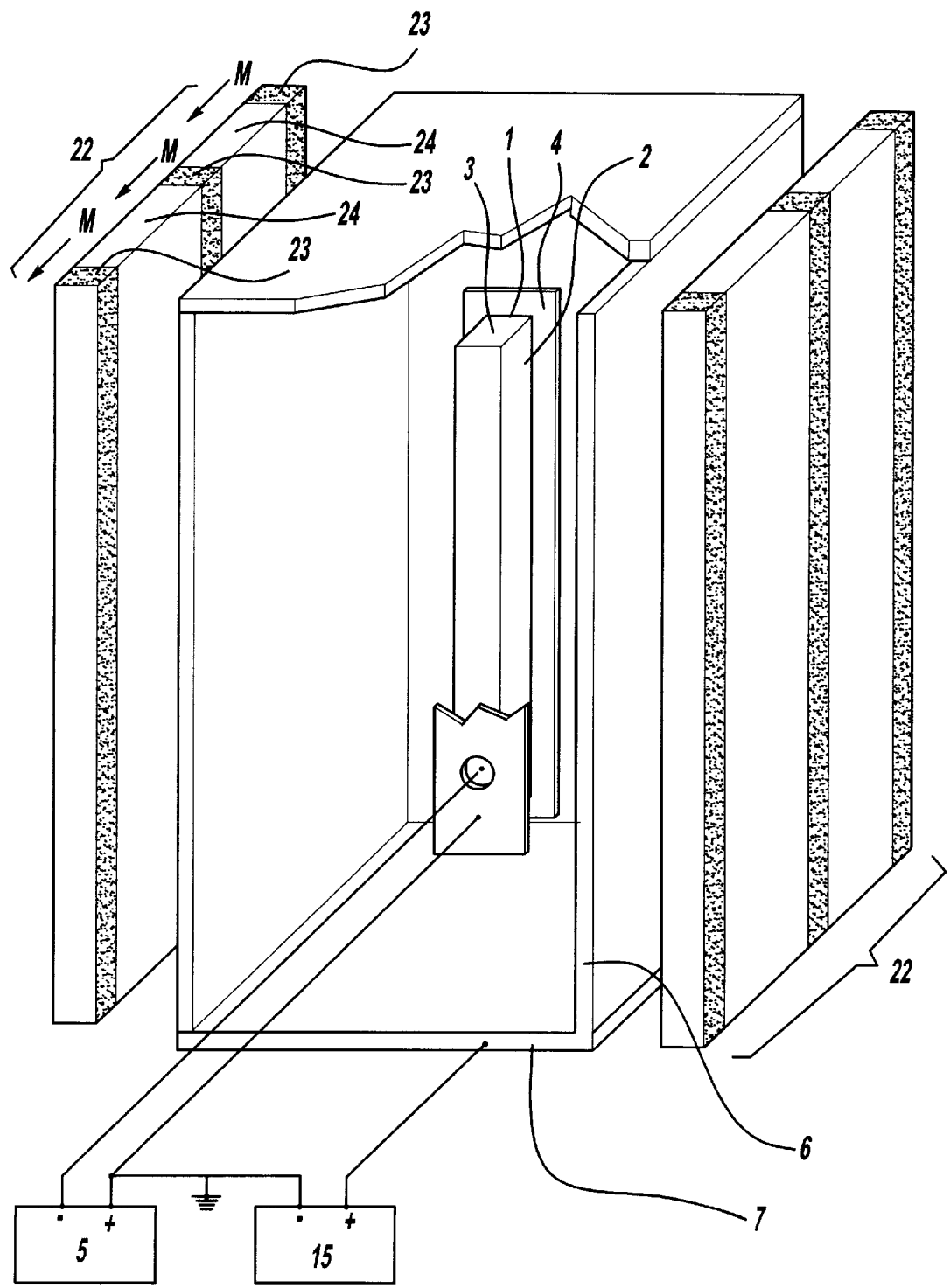
FIG. 3 is a schematic drawing of a plasma source using permanent magnetic means.

In FIG. 3, permanent magnet assemblies 22 are disposed parallel to each other, to deflection electrodes 6 disposed between them. The magnet assemblies comprise permanent magnets 23 separated by pole pieces 24. The direction of magnetization of all magnets 23 is the same, parallel to the deflection electrodes and perpendicular to the long direction of the cathode as indicated by the small arrows "M". Magnet assemblies 22 may preferably be longer than cathode 1 and more preferably longer than deflection electrodes 6 in order to provide a uniform magnetic field over cathode ends 3 and end deflection electrodes 7.

Figure 4:
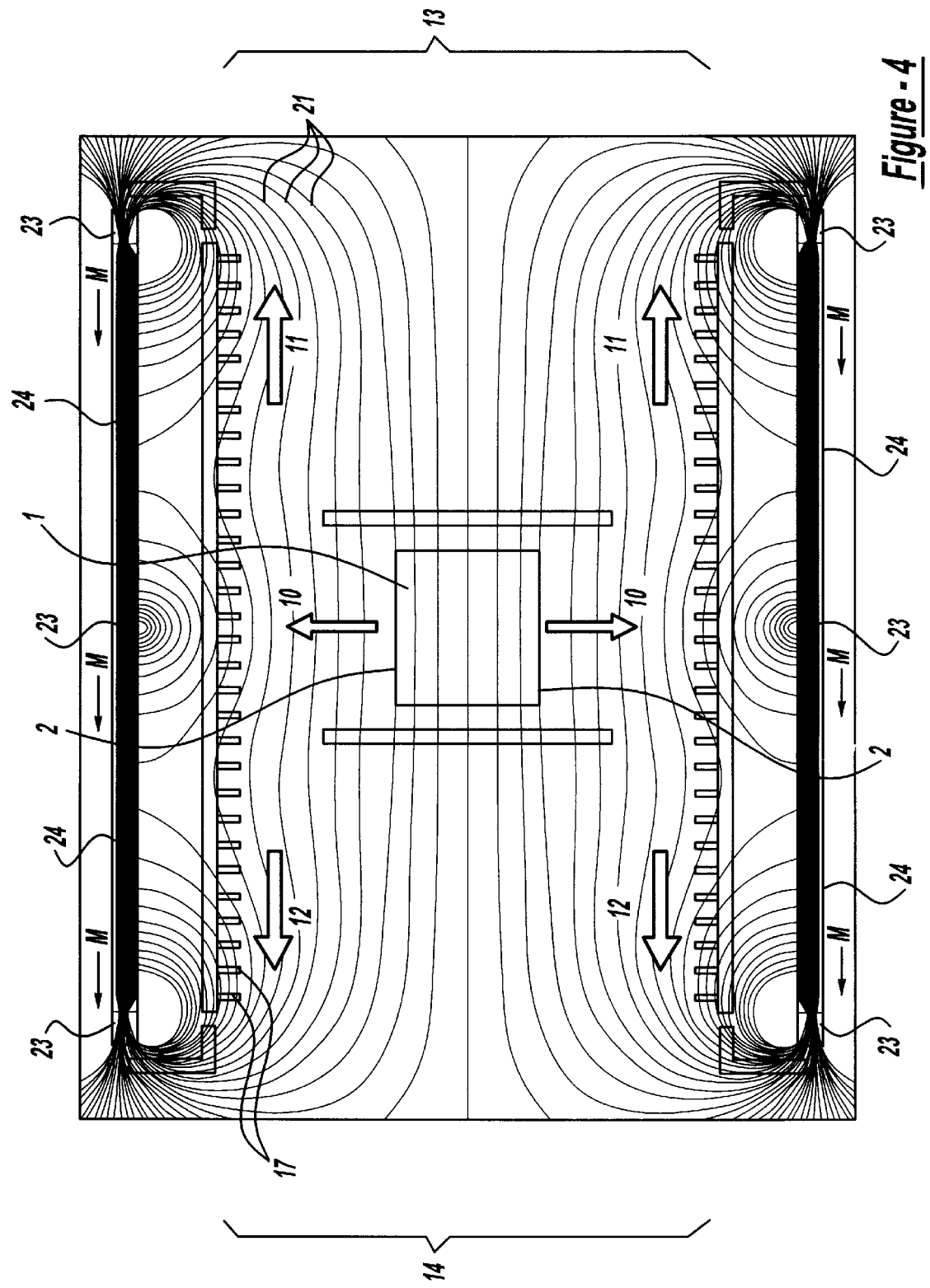
FIG. 4 is a cross-sectional drawing through a preferred embodiment of the invention using permanent magnetic means, showing magnetic flux lines.

In FIG. 4, a cross section of a preferred embodiment is shown in which permanent magnet assemblies 22 are disposed parallel to each other and outside deflection electrodes 6. Assemblies 22 comprise permanent magnets 23 separated by permeable pole pieces 24. The anode comprises side shields 4 and anode segments 16. Magnetic flux lines 21 generated by assemblies 22 are substantially parallel to evaporable surface faces 2 and deflection electrode 6. The shape and location of magnets and pole pieces were chosen by means of computer modeling to provide the desired magnetic field shape for the particular electrode geometry shown. For neodymium-iron-boron magnets (35 megagauss-oersted energy product) having relative dimensions as shown with respect to the electrodes, independent of actual scale, the field strength in the region adjacent to evaporable surfaces 2 is about 70 gauss.

In reference to all figures, mounting and cooling of the cathode, anode, and filtering apparatus can be accomplished by known methods not shown. Some blockage of plasma flow due to cooling and power connections and mechanical supports is unavoidable, however the connections may preferably be made at the ends of the cathode, leaving the sides unobstructed along their entire length. The cathode has the general shape of a rectangular bar, but may comprise multiple segments or replaceable elements for convenience in operation and maintenance. The arc may be prevented from moving laterally off the edge of the evaporable surface by known means, e.g. insulators, shields, conductive rings, or permeable rings.

This invention may be further developed within the scope of the following claims. Accordingly, the above specification is to be interpreted as illustrative of only a single operative embodiment of the present invention, rather than in a strictly limited sense.

What I claim is:

1. An apparatus for generating oppositely directed plasma streams comprising ionized vapor of a cathode material, said apparatus comprising cathode means, filter means, magnetic means, arc power supply means, and anode means; said apparatus having oppositely facing output apertures from which said plasma streams are emitted;

said cathode means being connected to the negative output of said arc power supply means and functioning to emit material comprising plasma and macroparticles of said cathode material; said cathode means having an evaporable surface from which said emission occurs; said cathode having substantially the shape of a rectangular bar having four long sides and two ends; said evaporable surface consisting of two opposite long sides and both ends of said bar;

said filter means comprising deflector means and cathode side shield means; said filter means functioning to transmit at least part of said plasma to said substrate region while preventing or reducing transmission of said macroparticles;

said deflector means comprising at least two deflector surfaces; each of said deflector surfaces mounted parallel to and facing one of said long sides of said evaporable surface; said deflector means functioning to deflect said plasma emitted by said cathode into two directions parallel to said deflector surfaces;

said side shield means comprising at least two surfaces mounted on opposite sides of said evaporable surface and projecting outward from said evaporable surface by a selected distance; said side shield means functioning to prevent at least a portion of said macroparticles emitted from said evaporable surface from reaching said output apertures;

said magnetic means comprising at least one permanent magnet or electromagnet and functioning to generate a magnetic field in the region between said cathode means and deflector means, said magnetic field having flux lines substantially parallel to said evaporable surface and said deflector surfaces;

said anode means comprising at least one surface in electrical contact with said plasma, said anode means being connected to the positive output of said arc power supply means.

2. The apparatus as in claim 1 in which said magnetic means comprises at least 2 magnet assemblies, each assembly comprising at least 2 permanent magnets separated by at least one magnetically permeable pole piece; said magnet assemblies being disposed parallel to each other and to said deflector means; and in which said cathode means and deflector means are disposed between said magnet assemblies.

3. The apparatus as in claim 1 or 2 further comprising a deflector bias power supply having its positive output connected to said deflector surfaces and its negative output connected to said anode means.

* * * * *